United States Patent [19]

Van Orsdel

[11] Patent Number: 4,654,662
[45] Date of Patent: Mar. 31, 1987

[54] APPARATUS FOR TELEMETRY APPARATUS FOR READING UTILITY METERS

[76] Inventor: James Van Orsdel, 7310 Middlebury Pl., Charlotte, N.C. 28212

[21] Appl. No.: 633,705

[22] Filed: Jul. 23, 1984

[51] Int. Cl.$^4$ ............................................. G08C 19/16
[52] U.S. Cl. ........................... 340/870.03; 340/347 M; 340/688
[58] Field of Search ....................... 340/870.02, 870.03, 340/688, 347 M, 310 A

[56] References Cited

U.S. PATENT DOCUMENTS 3,656,112 4/1972 Paull ............................... 340/870.02
4,337,466 6/1982 Spahn ......................... 340/870.02 X

*Primary Examiner*—Jerry W. Myracle
*Attorney, Agent, or Firm*—W. Thad Adams, III

[57] ABSTRACT

A telemetry apparatus is disclosed for reading utility meters. The apparatus includes a meter-base unit 10 mounted in a conventional utility meter and comprising a plurality of sensors (18a–18e) positioned to sense numerical data displayed on a conventional meter number wheel set 13. Sensors 18a through 18e preferably comprise pads 52 positioned on the face of wheels 13 which are sensed by feather switches 55. The signals are processed by a microprocessor and are converted from parallel to serial form and transmitted in a bit stream to the mobile unit 30. A security circuit 50 is provided for sensing whether the meter-based unit 10 has been tampered with. The security circuit 50 includes operational amplifier sections 74a and 74b which operate as latches to hold the voltage at a predetermined position if the flow of current through a current loop 51 is interrupted. The mobile unit 50 includes a key pad 33 through which the meter-based unit 10 can be interrogated by a transmitter 36.

7 Claims, 8 Drawing Figures

APPARATUS FOR TELEMETRY APPARATUS FOR READING UTILITY METERS

TECHNICAL FIELD AND BACKGROUND OF THE INVENTION

This invention relates to a telemetry apparatus for reading utility meters such as gas, water and electric meters. Sometimes, these meters are located inside buildings or other enclosures which make it difficult for the meter to be read manually. More often, the meters are accessible but are simply located a considerable distance from the street. Therefore, a meter reader must spend a considerable amountof time reading a single meter. Especially in residential areas, it is often necessary to park the reader's vehicle in the street, walk down a driveway and into the park of a residence, read and record the meter data, walk back down the driveway, get into the vehicle, travel a short distance down the street and repeat the entire process. Utility companies keep careful statistics about the cost of manually reading meters and, based upon the savings to be realized, often adopt practices such as reading meters at longer intervals to reduce the number of visits required to a particular meter. However, this reduces the cash flow of the utility company since the gas, water or electricity is not paid for by the consumer for a longer period of time after it is used.

To eliminate this disadvantage, many utilities read meters only once every two or three months but, in the interim, interpulate from previous readings and send estimated bills based on prior usage. Then, when the meter is read and the actual utility usage obtained, the bill based upon the actual reading is adjusted to take into account the estimated billings of prior months. However, this practice has historically caused a considerable number of consumer complaints based upon perceived variations in monthly billings which do not apparently coincide with actual utility usage. Since the expense of reading meters must obviously be born by the consumer, the inefficiencies inherent in manual meter reading are utlimately reflected in higher utility rates.

For this reason, numerous proposals have been made for alternating the reading meter process by permitting the meter to be read from a remote location. Some of these proposals require making electrical and/or mechanical connections between fixed and portable units such as, for example, by plug and socket devices which are susceptible to tampering and environmental deterioration over a period of time.

Other proposals involve transmission of the meter readout by wire to a central orifice by use of utility or telephone wires. However, these proposals require a substantial up-front capital investment by a utility company which would be reflected in higher rates and therefore opposed by consumers. Proposals have also been made for transmitting a meter readout by radiant energy which is received by a portable transceiver which includes means to display and record the information received. However, prior art devices of this type have, to date, been themselves expensive and susceptible to a variety of difficulties such as the inability for them to be read manually if required and the ability to detect evident of tampering.

Also, to reduce the capital investment required to install such a system, it is essential to make use of existing meters.

SUMMARY OF THE INVENTION

Therefore, it is an object of the invention to provide a telemetry apparatus for reading utility meters which can be incorporated on to existing utility meters.

It is another object of the present invention to provide a telemetry apparatus for reading utility meters which can, nevertheless, be read manually if required.

It is another object of the present invention to provide a telemetry apparatus for reading utility meters which includes means for detecting evidence of tampering.

It is yet another object of the present invention to provide a telemetry apparatus for reading utility meters which permits the use of many types of sensors for recording information off of the existing utility meter number wheels.

It is yet another object of the invention to provide a telemetry apparatus for reading utility meters which includes a base unit which is entirely enclosed within an existing utility meter.

These and other objects and advantages of the present invention are achieved in the preferred embodiment described below by providing a telemetry apparatus for reading utility meters and the like which is characterized by being adaptable for operation on a conventional, visual display mechanical meter. The telemetry apparatus comprises a meter-based unit mounted on a meter and comprising a plurality of sensors positioned to sense numerical data displayed on a conventional meter number wheel. Parallel means to serial converting means are provided for converting the information sensed into a serial bit stream and transmitting the bit stream upon receipt of an interrogation signal.

The telemetry apparatus also includes a mobile unit for interrogating the meter-based unit and which includes a transceiver for transmitting and interrogation signal to the meter-based unit and receiving a reply signal from the meter based unit containing the numerical data. Serial to parallel converting means are provided for converting the numerical data in bit stream form to serial, numerical form and recording the data for later processing.

According to the embodiment disclosed below, the telemetry apparatus includes security means for detecting whether the meter has been tampered with and altering the parallel to serial converting means output to indicate that tampering has taken place.

The sensors of the telemetry apparatus preferably comprise contact pads positioned on the number wheel and feather switches for reading contact pads and conveying the information contained in the contact pads.

Also, the telemetry apparatus includes coding means for limiting access to the numerical data to an authorized interrogator.

BRIEF DESCRIPTION OF THE DRAWINGS

Some of the objects of the invention have been set forth above. Other objects and advantages will appear as the description of the invention proceeds, when taken into conjunction with the following drawings, in which.

DESCRIPTION OF THE PREFERRED EMBODIMENT

Figure 1:
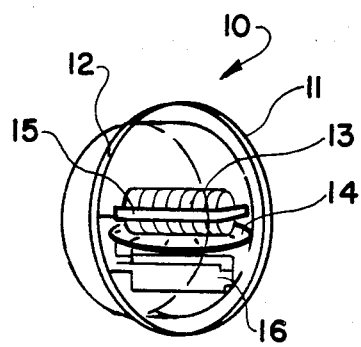
FIG. 1 is a perspective view of a conventional electric utility meter covered with a glass dome, with the meter based unit with the telemetry apparatus contained therein.

Referring now specifically to the drawings, a conventional, electric utility meter-based and glass cover, dome is shown and identified collectively at reference numeral 10. Conventionally, the electric meter includes a circular base 11 which is typically mounted on a vertical, exterior building wall and a clear glass dome cover 12 which locks onto base 11 and protects the internal components from exposure while permitting visual access.

Meter 10 includes a conventional number wheel set mounted on base 11 and visually accessible through cover 12. Meter 10 also includes a rotating disk 14 which gives visual evidence that electric current is flowing through meter 10 at a given rate. Meter 10 also includes a sensor support bracket 15 and a circuit module 16. Both of which will now be explained in further detail.

Figure 2:
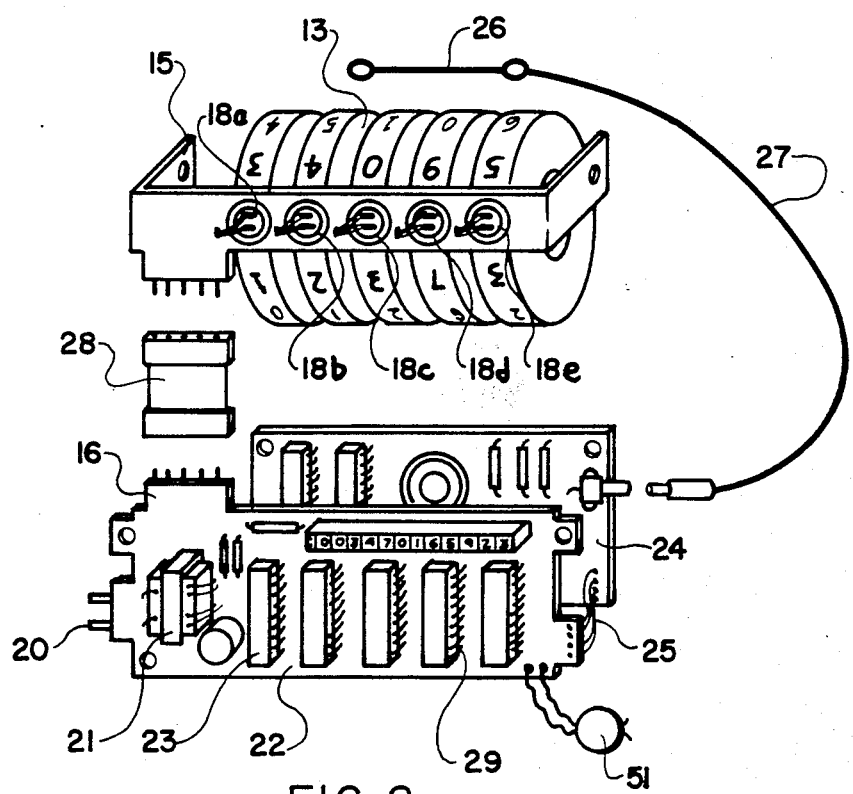
FIG. 2 is a fragmentary, greatly enlarged view of the mobile-based unit of the telemetry apparatus shown in FIG. 1.

Referring now to FIG. 2, sensor support bracket 15 contains five sensors, 18a through 18e, inclusive. One of these sensors is positioned directly over the face of the five number wheels in the number wheel set 13. Circuit module 16 includes a male plug 20 which connects circuit module 16 to the existing power source at the meter 10. A transformer 21 converts the current to 5 volts DC for use by the circuit module. board 22 is provided with a micro processor 23 which will be described in further detail below.

Board 24 is electrically connected to board 22 by electrical wires 25 and contains a 5 volt DC transceiver. Signals are transmitted and received by a transmit receive antenna 26 which is connected to transceiver circuit board 24 by a shielded cable 27 which may suitably be mounted glass dome 15.

Signals are transmitted from sensors 18a through 18e to circuit modules 16 by a connecting ribbon 28.

Finally, identification means 29 are provided on circuit board 22 for accessing a number which may represent a customer account number and permits the information transmitted to be correlated to a particular account.

Figure 3:
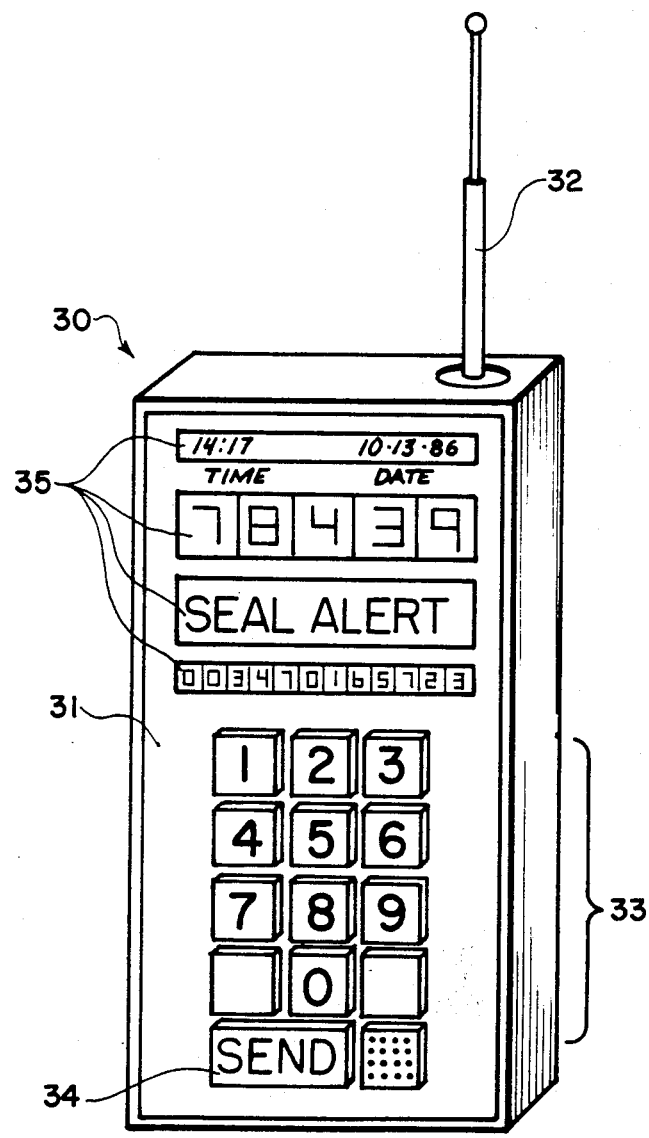
FIG. 3 is a perspective view of a mobile unit according to the present invention.

Referring now to FIG. 3, the mobile unit according to the present invention is shown and generally indicated at reference numeral 20. Mobile unit 30 includes a unit housing 31 through which extends a transmitting and receiving antenna 32. Unit 30 also includes a key pad 33 for entering data for transmission to the meter-based unit 10 with a send switch 34 for initiating the transmission. The display 35 includes means for displaying the time and date, the meter reading, a seal alert which indicates whether the meter has been tampered with, and a display for encoding the customer's account number of some other identification number which permits access to the meter-base unit 10.

Figure 4:
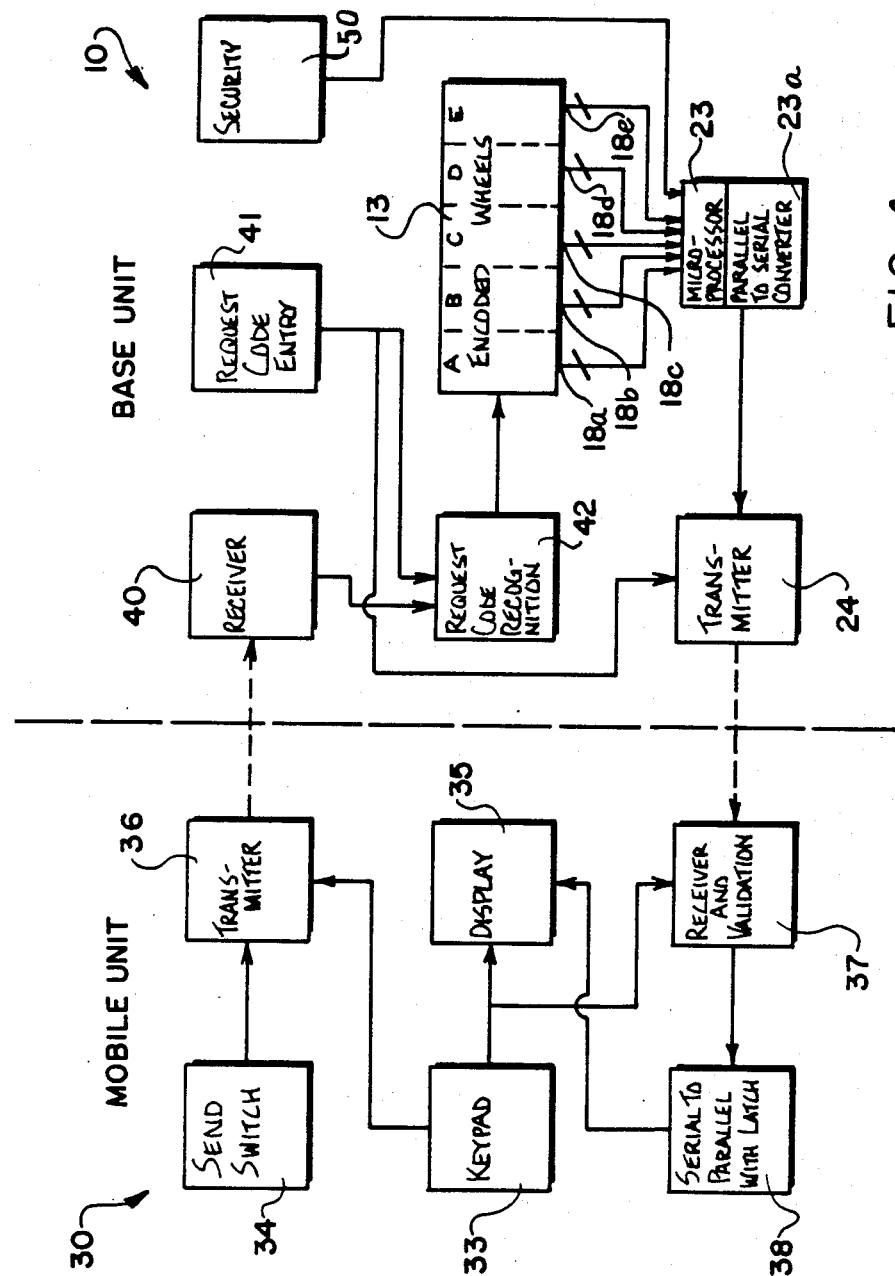
FIG. 4 is a block diagram of the mobile unit and a meter-based unit according to the present invention.

Referring now to FIG. 4, an access code corresponding to the device to be interrogated is entered by means of the key pad 33. This information can be visually verified on the display 35 and then sent to the meter-based unit 10 by depressing the send button 34. The send switch activates a mobile unit transmitter 36 which emits a pre-determined radiant energy signal.

A receiver 40 is always on standby and, when it receives a signal from transmitter 36 activates the remaining circuit component. Activation of the remaining circuitry occurs only if the request code received corresponds to a request code previously set in the base unit 10 in a request code entry circuit 41. Receiver 40 sends the signal to a request code recognition circuit 42 which compares the signal received with that stored in request code entry circuit 41. The encoded wheels 13 are read by sensors 18a through 18e. The signals are transmitted to the micro processor 23 and a parallel to serial converter 23a. A tamper circuit 50 is also interrogated. If a tamper seal 51 (see FIG. 2) has been broken since the meter was last read, memory of this occurrence is stored in the security circuit 50. If the unit has not been tampered with, digital bit stream is conveyed to transmitter 24, where the signal is transmitted to the mobile unit 30.

Mobile unit 30 includes a receiver 37 which compares the signal received to the data entered on the key pad 33. Information which is recognized is passed to a serial to parallel converter 38 which includes a latch, and to the display 35 where the meter reading can be read by the operator. If the meter-based unit 10 has been tampered with, the signal also activates the seal alert portion of display 35.

Figure 5:
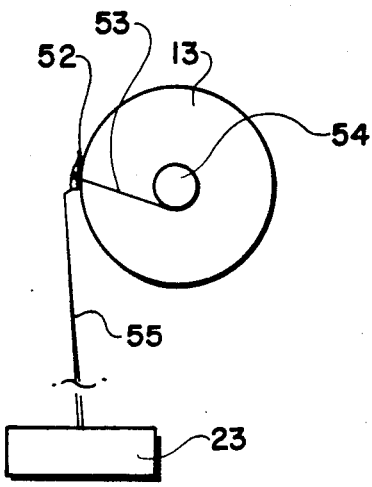
FIG. 5 is a fragmentary, second elevational view of a single conventional meter number wheel modified according to the present invention.
Figure 6:
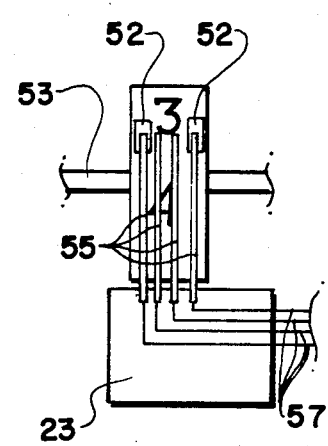
FIG. 6 is a fragmentary, front elevational view of the conventional meter number wheel shown in FIG. 5.

Referring now to FIG. 5, the means for determining data readout in the meter-based unit 10 is explained. Each of the wheels 13 is provided with contact pads 52 which are spaced between the visual numbers on the surface of the wheel and are in modified binary form with binary 10(1010) representing 0. These contact pads 52 are grounded bia. a wire 53 to the center shaft 54 of the wheels 13. Sensors 18a through 18e also include, respectively, another switch 55 which reads the pads 52 and completes the ground to the microprocessor 23, which includes a suitable interface.

Figure 7:
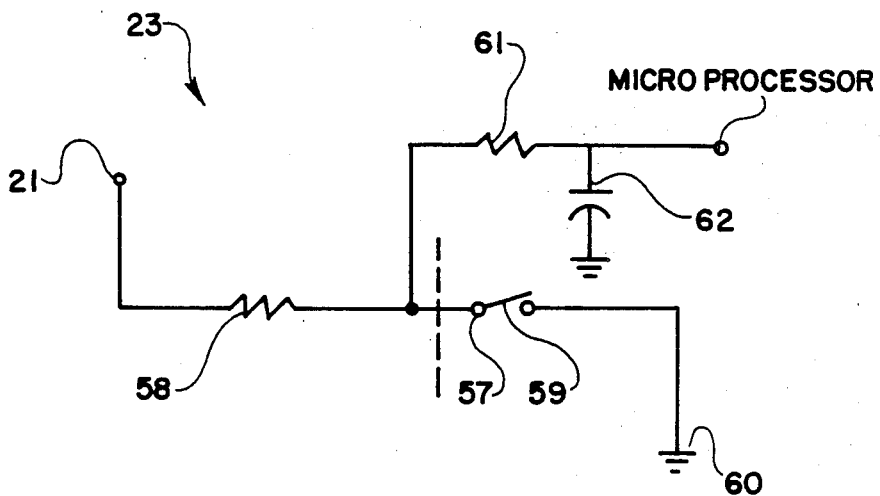
FIG. 7 is a circuit diagram of an interface circuit for conveying information from the meter number wheels to the micro processor.

The encoded wheels 15 are interfaced with the micro processor in the meter-based unit 10 with a three-component circuit shown in FIG. 7. One of the circuits is contained on each data line on each of the sensors 18a through 18e. A 1000 OHM 58 limits the current through a switch 59 when the switch is closed and connected to ground 60. A 100 OHM resistor 61 and a 4.7 MFD capacitor 62 sets up a time constant to remove "chatter" to the inputs at the micro processor. The entire interface resistance is small enough that when the switch 59 is open, the input to the micro processor will see the input as the voltage level of the power supply from transformer 21. One interface is provided for each of the four feature switches 55 for each of the five meter wheels.

Figure 8:
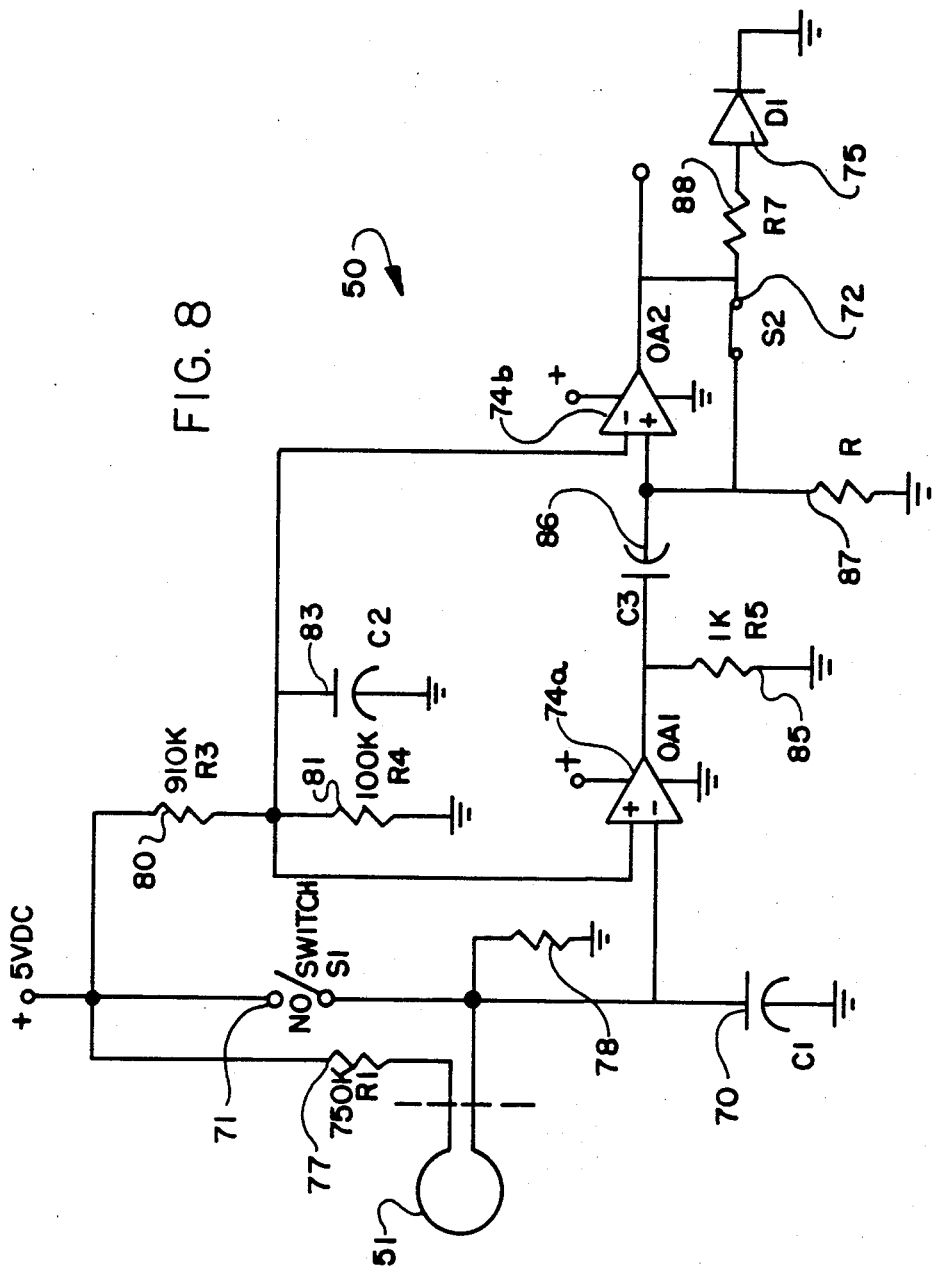
FIG. 8 is a circuit diagram of the tamper alarm circuit according to the present invention.

Referring now to FIG. 8, the tamper alarm security circuit 50 utilizes conventional alarm theory. A low power current loop defines the tamper seal 51. The alarm is set if the current loop 51 is broken. A capacitor 70 on current loop 51 sets a time constant to allow the alarm to be turned off by a two position switch, 71, 72, if the seal is to be broken without the alarm being activated. If the switch 72, 71 is not operated within a designated time, the alarm is activated. A latching circuit contained in the microprocessor will hold the data even if the circuit loop 51 is re-established.

Circuit 50 also includes quad-operational amplifier 74 for making its logic decisions, based upon positive current flow. An LED 75 remains on until investigation of the tamper circuit is completed, and is then reset.

In the event of a power outage, the resumption of power will not trigger the alarm. However, if the alarm has been activated prior to the power outage, the microprocesor will have latched this data and still indicate this condition to the remote unit.

Two 750 K resistors 77 and 78 limit the current through the current loop 51. With a 5 Volt power supply disclosed in this application, current is limited to 3.3 microamps. The two resistors being the same causes the voltage level to be half the power supply, in other words, 2.5 Volts DC.

As described above, the capacitor 70 delays the alarm to allow the cabinet to be closed or the alarm to be disconnected after the cabinet is opened by switch 71, 72. The capacitor is held at 2.5 Volts until the current loop is broken. After the current loop is broken, the capacitor drains through resistor 78 providing the delay time.

Resistors 80 and 81 act as voltage dividers to provide a 0.5 voltage level to the two utilized sections 74a, 74b of the operational amplifier.

A 30 MFD capacitor 83 prevents the voltage provided to operational amplifier sections 74a and 74b from rising faster than the value of the current loop which is delayed by capacitor 70. This prevents the alarm from being triggered when power is re-established to the circuit.

Operational amplifier sections 74a and 74b are one-fourth of a LM324N quad, and are wired as a comparator without hysteresis. Wired in this manner, the output of operational amplifier section 74a will swing to the supply voltage is the "positive" terminal has a greater voltage than the "negative" terminal. The "positive" terminal is set at 0.5 volts by the resistors 80 and 81. The "negative" terminal is set at 2.5 volts by resistors 77 and 78 if the current loop 51 is intact. If the current loop 51 is broken, the voltage at the negative terminal falls to 0, triggering operational amplifier section 74a. Without a hysteresis circuit, operational amplifier section 74a will produce a brief, high frequency burst on transition.

A resistor 85 provides a current drain to the output of operational amplifier section 74a. A capacitor 86 isolates operational amplifier section 74a from operational amplifier section 74b in DC operation. However, the high frequency burst produced by operational amplifier section 74a will pass through the capacitor 86 to trigger operational amplifier section 74b.

Operational amplifier section 74b is wired as a comparator with positive feedback. The negative terminal is set at 5 volts by resistors 80 and 81. The positive terminal is triggered by the high frequency burst provided by operational amplifier section 74a on transition. The peaks of this burst will reach 5 volts, causing the output of operational amplifier section 74b to go "high". Once the output of operational amplifier section 74b goes "high", the positive feedback will latch by holding the positive terminal high.

A resistor 87 allows the voltage to be held by capacitor 86 to drain to 0 volts when switch 72 is opened.

A resistor 88 limits the current through the circuit to LED 75 to prevent it from burning out.

Both the meter-based unit 10 and mobile unit 30 operates through an 8073 microprocessor developed by B-COMM Controls of Lumberton, N.C. The microprocessor is conventional with the exception of necessary buffers which have been added for the desired inputs and outputs, as will be apparent to those ordinarily skilled in the art.

A telemetry apparatus for reading utility meters and the like is described above. Various details of the invention may be changed without departing from the scope of the invention. Furthermore, the foregoing description of the preferred embodiment is for the purpose of illustration only and not for the purpose of limitation—the invention being defined by the claims.

I claim:

1. A telemetry apparatus for reading utility meters and the like and characterized by being adaptable for operation on a conventional, visual displayed mechanical meter, comprising:
   (a) a meter-based unit mounted on a meter and comprising a plurality of sensors positioned to sense numerical data displayed on a conventional meter number wheel; parallel to serial converting means for converting the information sensed by the sensors into a serial bit stream; a transceiver for receiving an interrogation signal and transmitting a responsive bit stream containing the meter number data; and
   (b) a mobile unit for interrogating said meter-based unit and comprising a transceiver for transmitting an interrogation signal to said meter-based unit and receiving a reply signal from said meter-based unit containing numerical data; a serial to parallel converting means for converting the numerical data in bit stream form into serial, numerical form and recording the data.

2. A telemetry apparatus according to claim 1 wherein said meter-based unit includes security means for detecting whether the meter has been tampered with and altering the parallel to serial converting means output to indicate that the meter has been tampered with.

3. A telemetry apparatus according to claim 1 wherein said sensors comprise contact pads positioned on said number wheel and feature switches for reading the contact pads and conveying the information contained in these contact pads.

4. A telemetry apparatus according to claim 1 wherein said utility meter comprises an electric meter which measures, accumulates and records the quantity of electricity used in a circuit downstream of the meter.

5. A telemetry apparatus according to claim 1, wherein said mobile unit comprises a hand held unit having a keyboard for entering information necessary to interrogate a particular meter-based unit.

6. A telemetry apparatus according to claim 1, wherein said mobile unit includes a visual display for permitting manual recordation of the numerical data transmitted to said mobile unit.

7. A telemetry apparatus according to claim 1, wherein said meter-based unit includes coding means for limiting access to said numerical data to an authorized interrogator, and wherein said mobile unit includes coding means for obtaining access to the numerical data generated by said meter-based unit.

* * * * *